(12) United States Patent
Wang et al.

(10) Patent No.: US 9,899,001 B2
(45) Date of Patent: Feb. 20, 2018

(54) DISPLAY PANEL, DISPLAY DEVICE HAVING THE SAME, AND CONTROLLING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Qian Wang, Beijing (CN); Xiaochuan Chen, Beijing (CN); Ming Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 5 days.

(21) Appl. No.: 15/037,905

(22) PCT Filed: Dec. 10, 2015

(86) PCT No.: PCT/CN2015/097037
§ 371 (c)(1),
(2) Date: May 19, 2016

(87) PCT Pub. No.: WO2016/188089
PCT Pub. Date: Dec. 1, 2016

(65) Prior Publication Data
US 2017/0124984 A1    May 4, 2017

(30) Foreign Application Priority Data

May 25, 2015    (CN) .......................... 2015 1 0272660

(51) Int. Cl.
*G09G 5/10*    (2006.01)
*H01L 27/32*    (2006.01)
(Continued)

(52) U.S. Cl.
CPC ......... *G09G 5/10* (2013.01); *G02F 1/133553* (2013.01); *G02F 1/133603* (2013.01);
(Continued)

(58) Field of Classification Search
CPC ............. H01L 27/3232; H01L 27/3211; G02F 1/133553; G02F 1/133603; G02F 1/133621; G02F 1/1368; G09G 3/2003
See application file for complete search history.

(56) References Cited

U.S. PATENT DOCUMENTS

2002/0033908 A1    3/2002   Mori et al.
2005/0195341 A1*   9/2005   Koganezawa .... G02F 1/133603
                                                      349/62
(Continued)

FOREIGN PATENT DOCUMENTS

CN    101086581 A    12/2007
CN    102655163 A     9/2012
(Continued)

OTHER PUBLICATIONS

International Search Report & Written Opinion dated Mar. 18, 2016 regarding PCT/CN2015/097037.
(Continued)

*Primary Examiner* — Alexander Eisen
*Assistant Examiner* — Kebede Teshome
(74) *Attorney, Agent, or Firm* — Intellectual Valley Law, P.C.

(57) ABSTRACT

The present application discloses a display panel comprising a first substrate; a second substrate opposite to the first substrate; a liquid crystal layer between the first substrate
(Continued)

and the second substrate; and an organic light emitting structure on a side of the second substrate distal to the liquid crystal layer. The organic light emitting structure comprises a light reflective layer for reflecting ambient light.

18 Claims, 5 Drawing Sheets

(51) Int. Cl.
*H01L 51/52* (2006.01)
*G02F 1/1335* (2006.01)
*G09G 3/20* (2006.01)
*G02F 1/1368* (2006.01)
*G02F 1/133* (2006.01)

(52) U.S. Cl.
CPC ..... *G02F 1/133621* (2013.01); *G09G 3/2003* (2013.01); *H01L 27/3211* (2013.01); *H01L 27/3232* (2013.01); *H01L 51/5218* (2013.01); *H01L 51/5221* (2013.01); *G02F 1/1368* (2013.01); *G02F 1/13318* (2013.01); *G02F 2001/133567* (2013.01); *G02F 2001/133626* (2013.01); *G02F 2201/52* (2013.01); *G02F 2201/58* (2013.01); *G09G 2360/144* (2013.01)

(56) References Cited

U.S. PATENT DOCUMENTS

| | | | | |
|---|---|---|---|---|
| 2007/0278951 A1* | 12/2007 | Koo | ........................ | B82Y 20/00 313/512 |
| 2010/0085289 A1* | 4/2010 | Munteanu | ............ | G09G 3/3406 345/88 |
| 2015/0356939 A1* | 12/2015 | Hsu | ...................... | G09G 3/3659 345/206 |

FOREIGN PATENT DOCUMENTS

| | | |
|---|---|---|
| CN | 104977754 A | 10/2015 |
| JP | 2004125963 A | 4/2004 |

OTHER PUBLICATIONS

First Office Action in the Chinese Patent Application No. 201510272660.X, dated Jun. 16, 2017; English translation attached.

\* cited by examiner

| R | G | B | R | G | B | R | G | B | R | G | B |
|---|---|---|---|---|---|---|---|---|---|---|---|
| R |   | B | R | G | B | R | G | B |   | G | B |
| R |   |   | R |   |   |   | G |   |   | G |   |
| B |   |   |   |   |   |   |   |   |   | G |   |

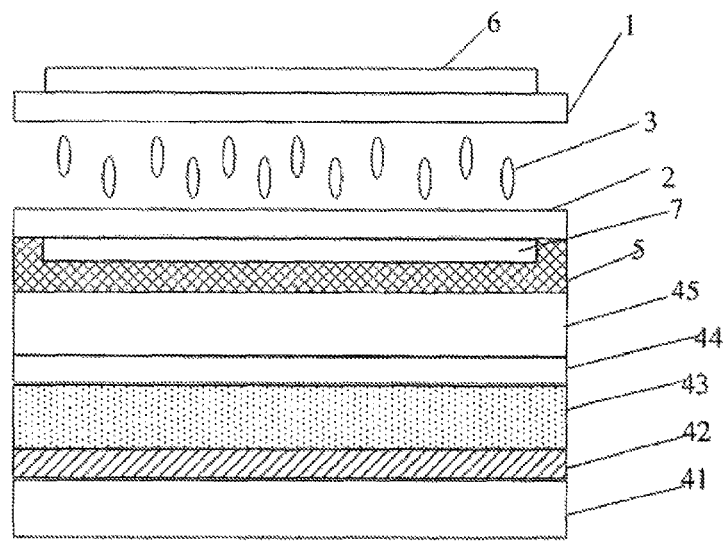

FIG. 6

| Generating a first control signal by the light sensor in response to an ambient light intensity equal to or higher than the threshold value; transmitting the first control signal to the control module; and turning off the organic light emitting structure upon receiving the first control signal. |
|---|

↓

| Generating a second control signal by the light sensor in response to the ambient light intensity below the threshold value; transmitting the second control signal to the control module; and turning on the organic light emitting structure upon receiving the second control signal. |
|---|

DISPLAY PANEL, DISPLAY DEVICE HAVING THE SAME, AND CONTROLLING METHOD THEREOF

CROSS-REFERENCE TO RELATED APPLICATION

This application is a national stage application under 35 U.S.C. § 371 of International Application No. PCT/CN2015/097037 filed Dec. 10, 2015, which claims priority to Chinese Patent Application No. 201510272660.X, filed May 25, 2015, the contents of which are incorporated by reference in the entirety.

FIELD

The present invention relates to display technology, more particularly, to a display panel, a display device having the same, and a controlling method thereof.

BACKGROUND

As compared to other conventional display devices, liquid crystal display devices are thinner and lighter, having low power consumption and high image display quality. A liquid crystal display device includes an array substrate having a thin film transistor, a color filter substrate opposite to the array substrate, and a liquid crystal layer between the array substrate and the color filter substrate. As liquid crystal display technology develops, many more issues associated with image quality and power consumption have arisen.

For example, liquid crystal display devices have found more and more applications in outdoor mobile devices. Conventional liquid crystal display devices have poor contrast when used outdoors where the ambient light is more intense. This makes it difficult for the readers to view the displayed image. Readers may increase the brightness of the outdoor display panel in order to view the image display better. However, this leads to much higher power consumption.

SUMMARY

In one aspect, the present invention provides a display panel comprising a first substrate; a second substrate opposite to the first substrate; a liquid crystal layer between the first substrate and the second substrate; and an organic light emitting structure on a side of the second substrate distal to the liquid crystal layer, wherein the organic light emitting structure comprises a light reflective layer for reflecting ambient light.

Optionally, the first substrate, the second substrate, the liquid crystal layer, and the organic light emitting structure are permissible for the ambient light to pass through to the light reflective layer.

Optionally, the light reflective layer provides backlight for the display panel by reflecting the ambient light when the organic light emitting structure is turned off.

Optionally, the organic light emitting structure further comprises a base substrate; an anode layer above the base substrate; a cathode layer above the base substrate; and an organic light emitting layer between the anode layer and the cathode layer.

Optionally, the cathode layer is above the base substrate and the anode layer is above the cathode layer.

Optionally, the cathode layer is the light reflective layer.

Optionally, the cathode layer is made of a non-transparent material, and the anode layer is made of a material selected from one of a transparent material and a semi-transparent material.

Optionally, the anode layer is above the base substrate and the cathode layer is above the anode layer.

Optionally, the anode layer is the light reflective layer.

Optionally, the cathode layer is made of a material selected from one of a transparent material and a semi-transparent material, and the anode layer is made of a non-transparent material.

Optionally, the non-transparent material comprises magnesium silver alloy.

Optionally, the non-transparent material comprises magnesium aluminum alloy.

Optionally, the transparent material comprises indium tin oxide.

Optionally, the display panel further comprises an optical adhesive layer between the second substrate and the organic light emitting structure.

Optionally, the second substrate, the first substrate, and the liquid crystal layer form a liquid crystal display panel having a first pixel size; the organic light emitting structure has a second pixel size, the second pixel size is N times of the first pixel size, N is an integer z 1.

In another aspect, the present invention provides a display device comprising a display panel, a light sensor configured to measure an ambient light intensity; and a control module configured to control the organic light emitting structure.

Optionally, the display panel comprises a first substrate; a second substrate opposite to the first substrate; a liquid crystal layer between the first substrate and the second substrate; and an organic light emitting structure comprising a light reflective layer on a side of the second substrate distal to the liquid crystal layer.

Optionally, the light sensor is configured to transmit a first control signal to the control module in response to an ambient light intensity no less than the threshold value, the control module is configured to turn off the organic light emitting structure upon receiving the first control signal.

Optionally, the light sensor is configured to transmit a second control signal to the control module in response to an ambient light intensity below the threshold value, the control module is configured to turn on the organic light emitting structure upon receiving the second control signal.

In another aspect, the present invention provides a method of controlling a display device. Optionally, the method comprises generating a first control signal by the light sensor in response to the ambient light intensity equal to or higher than a threshold value; transmitting the first control signal to the control module; and turning off the organic light emitting structure upon receiving the first control signal. Optionally, the method comprises generating a second control signal by the light sensor in response to the ambient light intensity below a threshold value; transmitting the second control signal to the control module; and turning on the organic light emitting structure upon receiving the second control signal.

Optionally, the threshold value is 20000 lux.

Optionally, the method further comprises displaying a full color image by field sequential color liquid crystal display technology.

Optionally, the displaying step comprising generating backlight using the organic light emitting structure; providing the backlight in a plurality of sequential frames, each of which consisting of a plurality of color fields; and driving liquid crystal in a pixel to obtain a deflection angle during each of the plurality of color fields.

BRIEF DESCRIPTION OF THE FIGURES

The following drawings are merely examples for illustrative purposes according to various disclosed embodiments and are not intended to limit the scope of the present invention.

FIG. 6 is a diagram illustrating the structure of a display panel in another embodiment.

FIG. 7 is a flow chart illustrating a method of controlling a display device in an embodiment.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
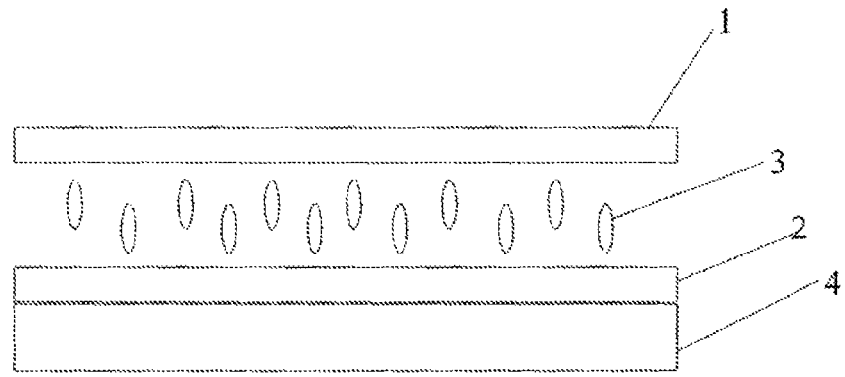
FIG. 1 is a diagram illustrating the structure of a display panel in an embodiment.

FIG. 1 is a diagram illustrating the structure of a display panel in an embodiment. Referring to FIG. 1, the display panel in the embodiment includes a first substrate 1, a second substrate 2 opposite to the first substrate, a liquid crystal layer 3 between the first substrate 1 and the second substrate 2, and an organic light emitting structure 4 on a side of the second substrate 2 distal to the liquid crystal layer 3. The organic light emitting structure 4 includes a light reflective layer for reflecting ambient light.

In some embodiments, the first substrate, the second substrate, the liquid crystal layer, and the organic light emitting structure are permissible for the ambient light to pass through to the light reflective layer. Optionally, the display panel includes a light transmissive region for ambient light to pass through to the light reflective layer. The organic light emitting structure can be turned on or off. Optionally, when the organic light emitting structure is turned on, the light reflective layer is used as an electrode (e.g., a cathode or an anode). Optionally, when the organic light emitting structure is turned off, the light reflective layer provides backlight for the display panel by reflecting the ambient light. Optionally, when the organic light emitting structure is turned on, the light reflective layer reflects light generated by the organic light emitting structure and ambient light passed through to the light reflective layer.

When the ambient light intensity is below a threshold value, the organic light emitting structure 4 is turned on, and emits light for providing backlight for the display panel. When the ambient light intensity is equal to or higher than the threshold value, the organic light emitting structure 4 is turn off, and reflects ambient light for providing backlight for the display panel. In some embodiments, the first substrate 1, the second substrate 2, and the liquid crystal layer 3 form a liquid crystal display panel. Optionally, the threshold value is about 1000 lux, about 2000 lux, about 5000 lux, about 7500 lux, about 10000 lux, about 20000 lux, about 30000 lux, about 40000 lux, about 45000 lux, about 50000 lux, about 55000 lux, about 60000 lux, about 70000 lux, about 80000 lux, about 90000 lux, or about 100000 lux.

The organic light emitting structure 4 provides backlight for the liquid crystal display panel in at least two ways. First, the organic light emitting structure 4 may emit light and the emitted light can be used as backlight for the liquid crystal display panel. Second, the organic light emitting structure 4 may also reflect light using one of the light reflective layers (e.g., a reflective electrode layer). The reflected light can be used as backlight for the liquid crystal display panel. In some embodiments, e.g., the ambient light intensity is low, the organic light emitting structure 4 emits light for providing backlight for the display panel. In some embodiments, e.g., the ambient light intensity is high, the organic light emitting structure 4 reflects ambient light for providing backlight for the display panel. Because the organic light emitting structure 4 is turn off when the ambient light intensity is high, the power consumption of the display panel can be reduced.

In some embodiments, when the ambient light intensity is high, the organic light emitting structure 4 is turn off, the backlight of the display panel is provided solely by the ambient light reflected by the organic light emitting structure 4. Moreover, when the intensity of the ambient light increases, the intensity of the light reflected by the organic light emitting structure 4 also increases. As a result, the intensity of the backlight received by the display panel also increases, and the brightness of the display panel is enhanced. Because the backlight is only provided by the reflected ambient light, it obviates the need for higher power consumption associated with conventional display panels when used under high intensity ambient light.

In some embodiments, when the ambient light intensity is low, e.g., below a threshold value, field sequential color liquid crystal display technology is applied for providing high resolution, two-dimensional image display. In this case, the organic light emitting structure 4 is turned on and the emitted light is used as backlight for the display panel.

FIGS. 2A-2G are diagrams illustrating a two-dimensional image display under low intensity ambient light in an embodiment. Referring to FIGS. 2A-2G, the first substrate 1, the second substrate 2, and the liquid crystal layer 3 forms a liquid crystal display panel. The first substrate 1 does not have a RGB color module. As a result, the light transmission rate of the display panel is several times higher than that of a display panel having a RGB color module. For example, the light transmission rate of the display panel can be around or above 30%, e.g., around or above 35% or around or above 40%.

The organic light emitting structure 4 in the embodiment includes a plurality of R, G, B pixels. The pixel size of the organic light emitting structure 4 is N times of that of the liquid crystal display panel (N≥1). Accordingly, the resolution of the liquid crystal display panel is N times of that of the organic light emitting structure 4.

In some embodiments, the pixel size of the organic light emitting structure 4 is four times of that of the liquid crystal display panel. In one example, the refresh rate of the organic light emitting structure 4 is 180 Hz during a display time for one frame of image, and the refresh rate of the liquid crystal display panel is 60 Hz. The organic light emitting structure 4 can display image in three fields, e.g., R field, G field and B field (FIGS. 2A-2F).

Figure 2A:
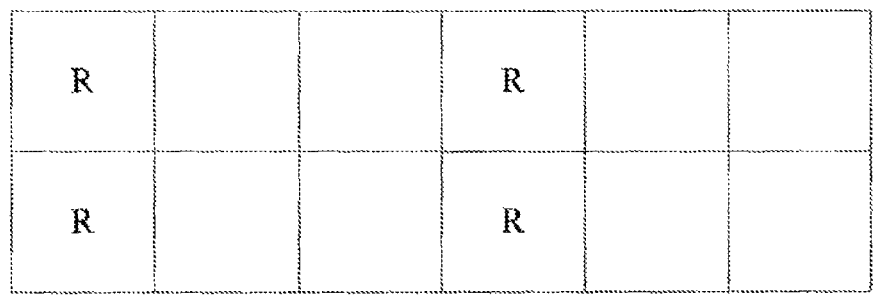
FIGS. 2A-2G are diagrams illustrating a two-dimensional image display under low intensity ambient light in an embodiment.
Figure 2B:
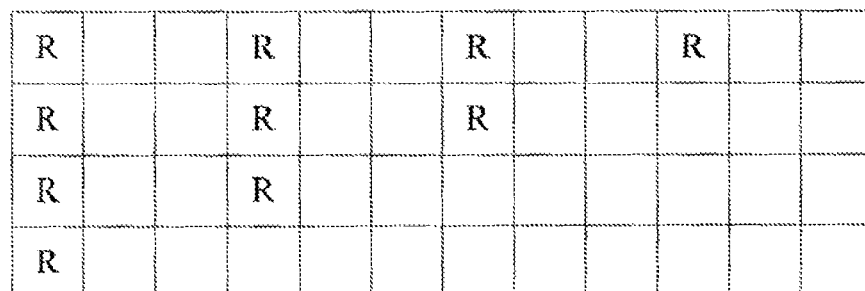
Figure 2C:
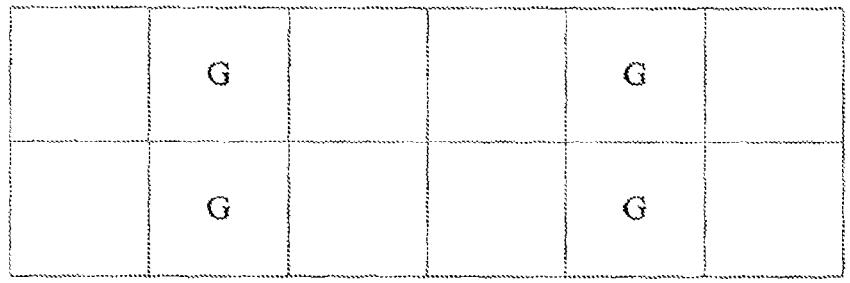
Figure 2D:
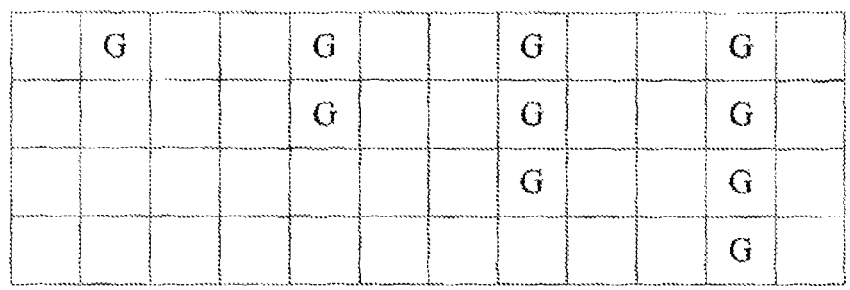
Figure 2E:
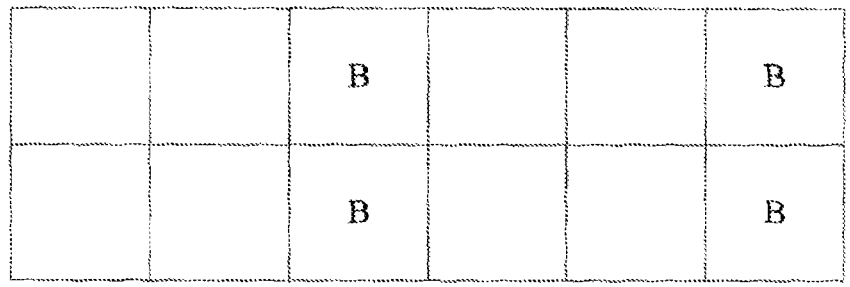
Figure 2F:
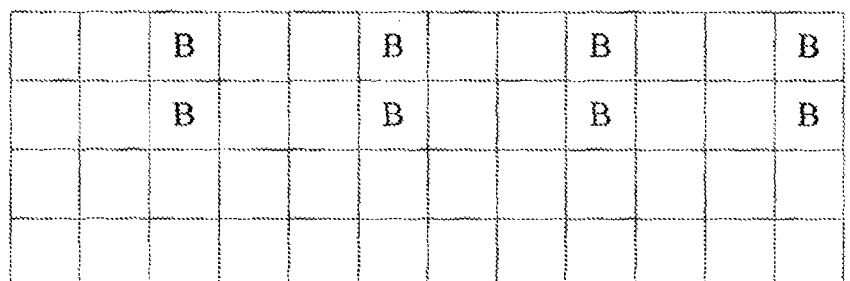
Figures 2G, 3:
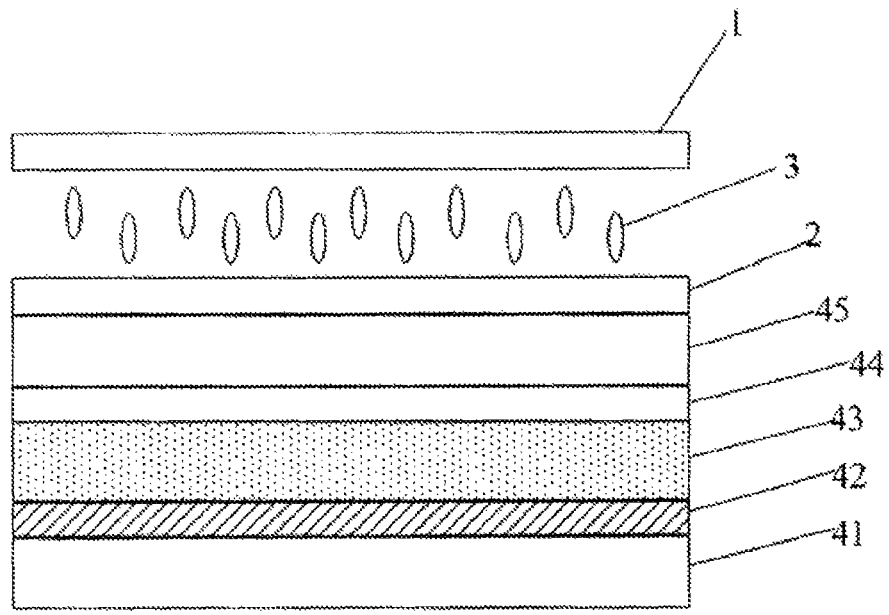
FIG. 3 is a diagram illustrating the structure of a display panel in another embodiment.

As shown in FIG. 2A, during the first field for a frame of image, all R pixels in the organic light emitting structure 4 are turned on. The light is subject to light mixing before it reaches the liquid crystal display panel. As shown in FIG. 2B, the R color in each pixel region has a certain grayscale. The deflection angle of the liquid crystal in each corresponding pixel may be adjusted to obtain an R color transmission rate required for displaying an R pixel having the desired grayscale. As shown in FIGS. 2C-2D, in the second field for a frame of image, the G color in each pixel region has a certain grayscale. The deflection angle of the liquid crystal in each corresponding pixel can be adjusted to obtain a G color transmission rate required for displaying a G pixel having the desired grayscale. As shown in FIGS. 2E-2F, in the third field for a frame of image, the B color in each pixel region has a certain grayscale. The deflection angle of the liquid crystal in each pixel can be adjusted to obtain a B color transmission rate for displaying a B pixel having the desired grayscale. FIG. 2G shows a complete image display having the desired R, G, and B grayscales.

In some embodiments, the resolution of the liquid crystal display panel is larger than that of the organic light emitting structure 4. In some embodiments, the resolution of the organic light emitting structure 4 is equal to or larger than that of the liquid crystal display panel.

Figure 4:
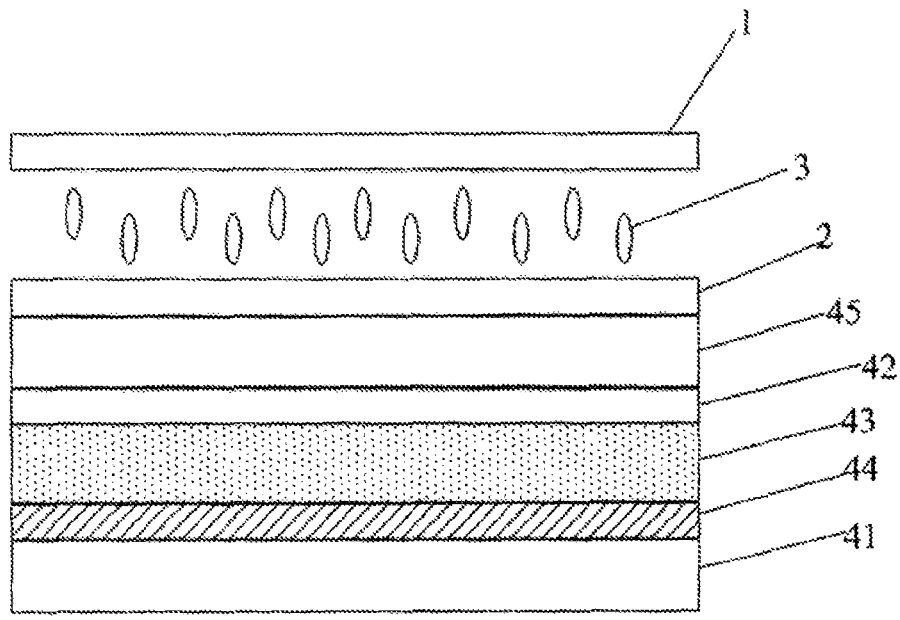
FIG. 4 is a diagram illustrating the structure of a display panel in another embodiment.

FIGS. 3 and 4 are diagrams illustrating the structures of display panels in some embodiments. Referring to FIGS. 3 and 4, the organic light emitting structure 4 in the embodiments includes a base substrate 41, an anode layer 44 above the base substrate 41, a cathode layer 42 above the base substrate 41, and an organic light emitting layer 43 between the anode layer 44 and the cathode layer 42. Optionally, the organic light emitting structure 4 further includes a top plate 45. Optionally, the anode layer 44, the organic light emitting layer 43, and the cathode layer 42 are sandwiched between the base substrate 41 and the top plate 45. In some embodiments, the cathode layer 42 is on the base substrate 41 and the top plate 45 is on the anode layer 44 (FIG. 3). In some embodiments, the anode layer 44 is on the base substrate 41 and the top plate 45 is on the cathode layer 42 (FIG. 4). Under low intensity ambient light, the organic light emitting structure 4 applies a voltage between the cathode layer 42 and the anode layer 44, causing the organic light emitting layer 43 to emit light to be used as backlight for the liquid crystal display panel. Under high intensity ambient light, the organic light emitting structure 4 is turned off, and there is no voltage between the cathode layer 42 and the anode layer 44. The organic light emitting layer 43 does not emit light. Instead, one of the electrode layers (e.g., the cathode layer 42 or the anode layer 44) reflects ambient light to be used as backlight for the display panel.

In some embodiments, the cathode layer 42 is above the base substrate 41 and the anode layer 44 is above the cathode layer 42. The cathode layer 42 is the light reflecting layer reflecting the ambient light to be used as the backlight for the liquid crystal display panel. In some embodiments, the anode layer 44 is above the base substrate 41 and the cathode layer 42 is above the anode layer 44. The anode layer 44 is the light reflecting layer reflecting the ambient light to be used as the backlight for the display panel. When the ambient light intensity is high, the organic light emitting structure 4 is turn off, the backlight of the display panel is provided only by the ambient light reflected by the organic light emitting structure 4. When the intensity of the ambient light increases, the intensity of the light reflected by the organic light emitting structure 4 also increases. As a result, the intensity of the backlight provided for the display panel also increases, and the brightness of the display panel is enhanced. Because the backlight is only provided by the reflected ambient light, this obviates the need for higher power consumption associated with conventional display panels when used under high intensity ambient light.

As discussed above, either the cathode layer 42 or the anode layer 44 can be used as the high intensity ambient light reflecting layer. When the cathode layer 42 is used as the high intensity ambient light reflecting layer, the cathode layer 42 is above the base substrate 41 and the anode layer 44 is above the cathode layer 42. The cathode layer 42 may be made of a non-transparent material, and the anode layer 44 may be made of a material selected from one of a transparent material or a semi-transparent material. The high intensity ambient light is reflected by the non-transparent cathode layer 42, transmits through the transparent or semi-transparent anode layer 44, and enters into the liquid crystal layer 3 for image display.

When the anode layer 44 is used as the high intensity ambient light reflecting layer, the anode layer 44 is above the base substrate 41 and the cathode layer 42 is above the anode layer 44. The cathode layer 42 may be made of a material selected from one of a transparent material or a semi-transparent material, and the anode layer 44 may be made of a non-transparent material. The high intensity ambient light is reflected by the non-transparent anode layer 44, transmits through the transparent or semi-transparent cathode layer 42, and enters into the liquid crystal layer 3 for image display.

In order to effectively reflect ambient light or light emitted from the light emitting layer 43 into the liquid crystal layer 3, the electrode layer adjacent to the base substrate 41 may be a non-transparent electrode layer, and the electrode layer adjacent to the top plate 45 may be a transparent or semi-transparent electrode layer. For example, when the cathode layer 42 is the light reflecting layer, the cathode layer 42 is made of a non-transparent material and the anode layer 44 is made of a transparent or semi-transparent material. When the anode layer 44 is the light reflecting layer, the anode layer 44 is made of a non-transparent material and the cathode layer 42 is made of a transparent or semi-transparent material.

The transparent electrode (e.g., a transparent cathode or a transparent anode) can be made of any suitable transparent material. In some embodiments, the transparent material includes indium tin oxide. The non-transparent electrode (e.g., a non-transparent cathode or a non-transparent anode) can be made of any suitable non-transparent material. In some embodiments, the non-transparent material includes magnesium silver alloy or magnesium aluminum alloy. The semi-transparent electrode (e.g., a semi-transparent cathode or a semi-transparent anode) can be made of any suitable semi-transparent material.

Figure 5:
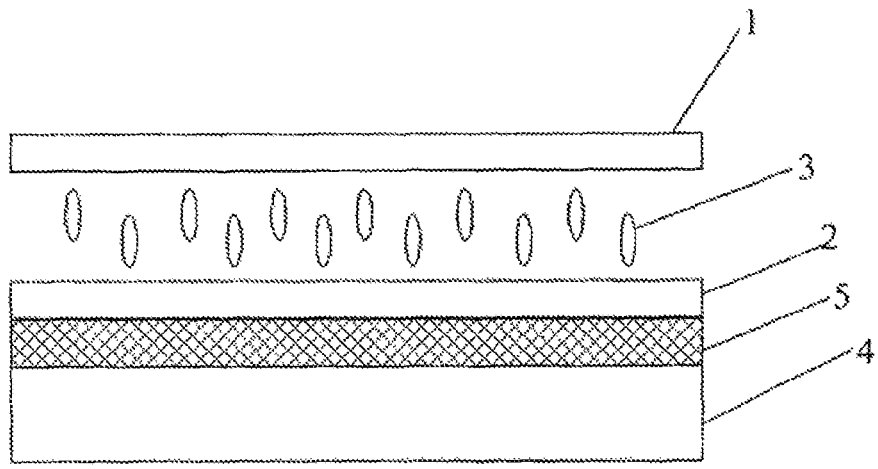
FIG. 5 is a diagram illustrating the structure of a display panel in another embodiment.

FIG. 5 is a diagram illustrating the structure of a display panel in another embodiment. Referring to FIG. 5, the display panel in the embodiment further includes an optical adhesive layer 5 between the second substrate 2 and the organic light emitting structure 4. The organic light emitting structure 4 is configured to provide backlight for the liquid crystal display panel by adhering to the liquid crystal display panel through the optical adhesive layer 5. The optical adhesive layer 5 fills the space between the organic light emitting structure 4 and the liquid crystal display panel, increasing the contrast level of the display device. The optical adhesive layer 5 also prevents light scattering, and have a refractive rate and light transmission rate similar to those of glass substrate. It is resistant to yellowing, is flexible, and is capable of withstanding different expansion/contraction rates of various base substrates. By using an optical adhesive layer 5, many issues associated with thermal changes during the adhesion process may be avoided.

FIG. 6 is a diagram illustrating the structure of a display panel in another embodiment. Referring to FIG. 6, the display panel in the embodiment further includes a first polarizer 6 on a side of the first substrate 1 distal to the liquid crystal layer 3, and a second polarizer 7 between the second substrate 2 and the optical adhesive layer 5. The light transmission axis of the first polarizer 6 is substantially perpendicular to light transmission axis of the second polarizer 7. This ensures that the light entering into the liquid crystal layer 3 is polarized light, which can be deflected by the liquid crystal layer.

The display panels described herein may be adapted for making any appropriate types display panels. In some embodiments, the display panel has a display mode selected from the group consisting of an Advanced Super Dimension Switch (ADS) mode, a Twisted Nematic (TN) mode, a High Aperture Ratio Advanced Super Dimension Switch (H-ADS) mode, and an In-plane Switching (IPS) mode.

In another aspect, the present disclosure further provides a display device including a display panel described herein, a light sensor configured to measure the ambient light intensity, and a control module configured to control the organic light emitting structure 4. When ambient light intensity is no less than the threshold value, the light sensor transmits a first control signal to the control module. Upon receiving the first control signal, the control module turn off the organic light emitting structure 4. When the ambient light intensity is below the threshold value, the light sensor transmits a second control signal to the control module. Upon receiving the second control signal, the control module turned on the organic light emitting structure 4.

In some embodiments, the organic light emitting structure 4 can be controlled by other mechanisms or controlled manually. For example, the organic light emitting structure 4 can be turned on and turned off by a user. In other words, the threshold value for turning on and off the organic light emitting structure 4 can be determined by the user. When the user determines that the ambient light intensity is high, the user can manually turn off the organic light emitting structure 4. When the user determines that the ambient light intensity is low, the user can manually turn on the organic light emitting structure 4.

The display devices described herein have a wide range of applications, including, but are not limited to, a mobile phone, a laptop, a computer, a monitor, a notebook, a digital album, and a gps, etc.

In another aspect, the present disclosure further provides a method of controlling a display device described herein. FIG. 7 is a flow chart illustrating a method of controlling a display device in an embodiment. Referring to FIG. 7, the method in the embodiment includes generating the first control signal by the light sensor in response to an ambient light intensity equal to or higher than a threshold value; transmitting the first control signal to the control module; and turning off the organic light emitting structure upon receiving the first control signal. The method further includes generating the second control signal by the light sensor in response to an ambient light intensity below the threshold value; transmitting the second control signal to the control module; and turning on the organic light emitting structure upon receiving the second control signal. In some embodiments, the display device is automatically controlled by the light sensor and the control module based on the intensity of the ambient light.

In some embodiments, the light sensor detects the intensity of the ambient light, and generates the first control signal when the ambient light intensity is no less than the threshold value. The first control signal is transmitted to the control module. Upon receiving the first control signal, the control module turns off the organic light emitting structure 4. The organic light emitting structure 4 reflects the ambient light. The backlight of the display panel is provided only by the ambient light reflected by the organic light emitting structure 4. The power consumption of the display panel can be reduced.

In some embodiments, the light sensor detects the intensity of the ambient light, and generates the second control signal when the ambient light intensity is below the threshold value. The second control signal is transmitted to the control module. Upon receiving the second control signal, the control module turns on the organic light emitting structure 4. The organic light emitting structure 4 emits light and provides backlight for the display panel.

Optionally, the threshold value is about 1000 lux, about 2000 lux, about 5000 lux, about 7500 lux, about 10000 lux, about 20000 lux, about 30000 lux, about 40000 lux, about 45000 lux, about 50000 lux, about 55000 lux, about 60000 lux, about 70000 lux, about 80000 lux, about 90000 lux, or about 100000 lux. Optionally, the threshold value is about 20000 lux.

In some embodiments, the method further includes displaying a full color image by field sequential color liquid crystal display technology. Optionally, the displaying step includes generating backlight using the organic light emitting structure and providing the backlight in a plurality of sequential frames. Each frame consists of a plurality of color fields. Optionally, the method further includes driving liquid crystal in a pixel to obtain a deflection angle during each of the plurality of color fields.

Under low intensity ambient light in an embodiment, field sequential color liquid crystal display technology is applied for providing high resolution, two-dimensional image display. In this case, the organic light emitting structure 4 is turned on and the emitted light is used as backlight for the display panel. As discussed above, in some embodiments, the organic light emitting structure 4 includes a plurality of R, G, B pixels. The pixel size of the organic light emitting structure 4 is N times of that of the liquid crystal display panel (N≥1). That is, the resolution of the liquid crystal display panel is N times of that of the organic light emitting structure 4. FIGS. 2A-2F provide an example wherein N=4. As exemplified in FIGS. 2A-2F, the organic light emitting structure 4 can display image in three fields, e.g., R field, G field and B field. The refresh rate of the organic light emitting structure 4 is 180 Hz during a display time for one frame of image, and the refresh rate of the liquid crystal display panel is 60 Hz.

During the first field for a frame of image, all R pixels in the organic light emitting structure 4 are turned on (FIG. 2A). The light is subject to light mixing before it reaches the liquid crystal display panel. The R color in each pixel region has a certain grayscale (FIG. 2B). The deflection angle of the liquid crystal in each corresponding pixel may be adjusted to obtain an R color transmission rate required for displaying an R pixel having the desired grayscale. In the second field for a frame of image, the G color in each pixel region has a certain grayscale (FIGS. 2C-2D). The deflection angle of the liquid crystal in each corresponding pixel can be adjusted to obtain a G color transmission rate required for displaying a G pixel having the desired grayscale. In the third field for a frame of image, the B color in each pixel region has a certain grayscale (FIGS. 2E-2F). The deflection angle of the liquid crystal in each pixel can be adjusted to obtain a B color transmission rate for displaying a B pixel having the desired grayscale. A complete image display having the desired R, G, and B grayscales can be achieved (FIG. 2G).

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus, comprising:
   a first substrate;
   a second substrate opposite to the first substrate;
   a liquid crystal layer between the first substrate and the second substrate; and
   an organic light emitting diode device having a plurality of first subpixels;
   wherein the first substrate, the second substrate, and the liquid crystal layer constitute a liquid crystal display panel having a plurality of second subpixels; and each of the plurality of first subpixels corresponds to one or more subpixels of the plurality of second subpixels;
   each of the plurality of first subpixels comprises a first electrode on a side of the second substrate distal to the liquid crystal layer; an organic light emitting layer on a side of the first electrode distal to the second substrate; and a second electrode on a side of the organic light emitting layer distal to the first electrode;
   the first substrate, the second substrate, the liquid crystal layer, the first electrode, and the organic light emitting layer are permissible for ambient light to pass through to the second electrode;
   the second electrode in each of the plurality of first subpixels is configured to reflect the ambient light directly into the corresponding one or more subpixels of the plurality of second subpixels absent of an electrical potential difference between the first electrode and the second electrode, thereby providing backlight to the liquid crystal layer for image display, an orthographic projection of each of the plurality of first subpixels on the second substrate at least partially overlaps with orthographic projections of the corresponding one or more subpixels of the plurality of second subpixels on the second substrate; and
   each of the plurality of first subpixels configured to emit light directly into the corresponding one or more subpixels of the plurality of second subpixels upon application of an electrical potential difference between the first electrode and the second electrode, thereby providing backlight for the liquid crystal layer for image display, the orthographic projection of each of the plurality of first subpixels on the second substrate at least partially overlaps with orthographic projections of the corresponding one or more subpixels of the plurality of second subpixels on the second substrate.

2. The display apparatus of claim 1, wherein the display apparatus comprises a light transmissive region in each of the first substrate, the second substrate, the liquid crystal layer, and the first electrode; the light transmissive region configured for allowing the ambient light to pass through to the second electrode.

3. The display apparatus of claim 1, wherein the orthographic projection of each of the plurality of first subpixels on the second substrate substantially overlaps with orthographic projections of the corresponding one or more subpixels of the plurality of second subpixels on the second substrate.

4. The display apparatus of claim 1, wherein the first electrode is a cathode and the second electrode is an anode.

5. The display apparatus of claim 1, wherein the second electrode is a cathode and the first electrode is an anode.

6. The display apparatus of claim 1, wherein the second electrode is made of a reflective conductive material, and the first electrode is made of a substantially transparent conductive material.

7. The display apparatus of claim 6, wherein the second electrode comprises magnesium silver alloy.

8. The display apparatus of claim 6, wherein the first electrode comprises indium tin oxide.

9. The display apparatus of claim 1, further comprising an optical adhesive layer between the second substrate and the first electrode.

10. The display apparatus of claim 1, wherein each of the plurality of first subpixels corresponds to N number of subpixels of the plurality of second subpixels;
    each of the plurality of second subpixels has a first pixel size;
    each of the plurality of first subpixels has a second pixel size; and
    the second pixel size is N times of the first pixel size, N is an integer ≥1.

11. The display apparatus of claim 1, further comprising:
    a light sensor configured to measure an ambient light intensity of the ambient light; and
    a controller configured to control the application of an electrical potential difference between the first electrode and the second electrode based on the ambient light intensity of the ambient light.

12. The display apparatus of claim 11, wherein the light sensor is configured to transmit a first control signal to the controller in response to the ambient light intensity no less than the threshold value, the controller is configured to turn off the application of an electrical potential difference between the first electrode and the second electrode upon receiving the first control signal.

13. The display apparatus of claim 11,
wherein the light sensor is configured to transmit a second control signal to the controller in response to the ambient light intensity below the threshold value, the controller is configured to turn on the application of an electrical potential difference between the first electrode and the second electrode upon receiving the second control signal.

14. A method of controlling a display apparatus of claim 11, comprising
generating a first control signal by the light sensor in response to the ambient light intensity equal to or higher than a threshold value;
transmitting the first control signal to the controller; and
turning off the application of an electrical potential difference between the first electrode and the second electrode upon receiving the first control signal.

15. A method of controlling a display device of claim 11, comprising:
generating a second control signal by the light sensor in response to the ambient light intensity below a threshold value;
transmitting the second control signal to the controller; and
turning on the application of an electrical potential difference between the first electrode and the second electrode upon receiving the second control signal.

16. A method of claim 14, wherein the threshold value is 20000 lux.

17. The method of claim 15, further comprising displaying a full color image by field sequential color liquid crystal display technology.

18. The method of claim 17, wherein displaying the full color image comprises:
turning on the application of an electrical potential difference between the first electrode and the second electrode thereby generating the backlight using light emitted from the organic light emitting layer;
providing the backlight in a plurality of sequential frames, each of which consisting of a plurality of color fields; and
driving liquid crystal molecules in each subpixel of the plurality of second subpixels to obtain a deflection angle during each of the plurality of color fields.

\* \* \* \* \*